United States Patent [19]
Logan et al.

[11] Patent Number: 5,905,626
[45] Date of Patent: May 18, 1999

[54] ELECTROSTATIC CHUCK WITH CERAMIC POLE PROTECTION

[75] Inventors: Joseph Logan, Jamestown, R.I.; Robert Tompkins, Millbrook, N.Y.

[73] Assignee: Dorsey Gage, Inc., Poughkeepsie, N.Y.

[21] Appl. No.: 09/058,734

[22] Filed: Apr. 12, 1998

[51] Int. Cl.⁶ .................................................. H02N 13/00
[52] U.S. Cl. ......................................... 361/234; 279/128
[58] Field of Search ................................... 361/230–235; 279/128

[56] References Cited

U.S. PATENT DOCUMENTS

| | | |
|---|---|---|
| 4,480,284 | 10/1984 | Tojo et al. . |
| 5,055,964 | 10/1991 | Logan et al. . |
| 5,073,716 | 12/1991 | Clemens et al. .......................... 361/234 |
| 5,099,571 | 3/1992 | Logan et al. ............................. 361/234 |
| 5,151,845 | 9/1992 | Watanabe et al. . |
| 5,463,526 | 10/1995 | Mundt . |
| 5,467,249 | 11/1995 | Barnes et al. . |
| 5,535,090 | 7/1996 | Sherman et al. ......................... 361/234 |
| 5,535,507 | 7/1996 | Barnes et al. ............................ 361/234 |
| 5,560,780 | 10/1996 | Wu et al. . |
| 5,572,398 | 11/1996 | Federlin et al. ......................... 361/234 |
| 5,656,903 | 8/1997 | Burkhart et al. ......................... 361/234 |
| 5,691,876 | 11/1997 | Chen et al. . |

*Primary Examiner*—Fritz Fleming
*Attorney, Agent, or Firm*—Joseph L. Spiegel

[57] ABSTRACT

Electrostatic chucks are disclosed in which a conductive pole piece is provided with a flat top surface, sidewall and a perimeter with radiused corners connecting the top surface to the sidewall. The perimeter and sidewall are coated with a ceramic insulative material covering the radiused corners. The top surface is coated with a ceramic semiconductive material. Then the surfaces of the pole piece not covered by ceramic material are anodized in such a manner that the intersections between anodized pole surfaces and ceramic material are below the pole piece top surfaces.

6 Claims, 6 Drawing Sheets

ELECTROSTATIC CHUCK WITH CERAMIC POLE PROTECTION

BACKGROUND OF THE INVENTION

1. Field of Invention

This invention relates generally to an electrostatic chuck used for holding a semiconductor wafer during processing and, in particular, to such a chuck that utilizes ceramic for protection of its pole pieces.

2. Description of the Prior Art

It is known to use thick semiconductive ceramic coatings such as alumina/titania on the clamping surface of an electrostatic chuck using thermal spray techniques. These coatings have a large difference in thermal expansion from the chuck body, do not break down destructively and must have a narrow range of resistivity to operate successfully. Also, the thickness of these coatings leads to excessive thermal resistance to the coated metal chuck body. These coatings also draw current detrimentally from a treating plasma environment when the coatings are carried out to the edge of the clamping surface, where contact with the plasma may take place. This material cannot be used in the joints between clamping poles and a frame member, as there will be too much conductive current drawn to the frame member.

It is known also to use insulating ceramic coatings such as alumina by applying same to the metallic clamping surface using thermal spray techniques. The application of such coatings to the body of the metallic chuck without stress failure is difficult. Breakdown field strength is not much different than the best anodized aluminum coatings. For bipolar or multipolar chucks, the ceramic must be applied to each pole and appropriate insulation applied for isolation of each pole from the support structure. If thick ceramic is used, this usually results in excessive thermal resistance between the pole and the coated support structure. Also, thick insulative coatings require very high clamping voltages (several thousand) which make the isolation of connections much more difficult to achieve.

It is known also to use organic coatings such as polyimide (Kapton) over a metal chuck. Such coatings have very high breakdown strength, but are easily damaged and are attacked easily by process plasmas.

Thick crystallization insulative coatings, such as sapphire, have been known to be bonded to the chuck clamping surface, usually in thick sheets. Such coatings have very high breakdown field strength, but are very brittle, difficult to apply to large areas in thin sheets and are very expensive.

It is also known to fire ceramic sheets with embedded metallic layers to form a chuck assembly and then bond same to a metal cooling/heating assembly containing connections to the chuck's electrodes.

The U.S. Pat. No. 4,480,284 to Tojo discloses an electrostatic chuck plate consisting of a flat electrode plate, a dielectric layer formed on one flat surface of the electrode plate by flame spraying and impregnated with plastics.

The U.S. Pat. No. 5,055,964 to Logan, et al discloses an electrostatic chuck on which an epoxy bond is formed between the anodized electrodes of the chuck.

The U.S. Pat. No. 5,151,845 to Watanabe, et al, discloses an electrostatic chuck with multiple insulating films of different insulation resistances.

The U.S. Pat. No. 5,463,526 to Mundt discloses an electrostatic chuck with a conducting layer covered with a thick semi conducting layer which in turn is covered with a thin dielectric layer upon which a wafer to be held and treated is placed.

In Barnes, et al, U.S. Pat. No. 5,467,249 an electrostatic chuck is disclosed wherein the outer electrode is surrounded by a dielectric ring having a dielectric inner radius less than the workpiece.

In U.S. Pat. No. 5,535,507 to Barnes, et al, a method of forming an electrostatic chuck is described in which a polyimide film is inserted between the anodized surfaces of the chuck's electrode. The present invention represents a specific improvement over Barnes, et al.

The U.S. Pat. No. to Wu, et al, 5,560,780 discloses an electrostatic chuck having a polymeric dielectric material (polyimide) formed thereon and protected by an inorganic aluminum compound such as aluminum oxide or aluminum nitride.

The U.S. Pat. No. 5,691,876 Chen, et al., to utilizes a polymide film within an electrostatic chuck as a dielectric layer.

What the prior art lacks is the ability to design and build monopolar, bipolar or multipolar chucks using ceramic semiconductive materials over low-cost aluminum base materials, provide insulative protection at the perimeter of the chuck to prevent harmful contact of the semiconductive ceramic materials with the surrounding environment (usually a plasma), and use anodized aluminum as a dielectric material to internally isolate the pole pieces or coat other features of the chuck such as the water channels.

SUMMARY OF THE INVENTION

An object of the invention is an improved electrostatic chuck.

Another object is such a chuck with means for protecting the poles of such a chuck.

Another object is a chuck whose dielectric medium is free of cracks or flaws that can lead to electrical breakdown.

Still other objects are such a chuck which can operate at relatively low d.c. voltage (less than 500 volts wafer to chuck), extreme flatness in the finished clamping surface, the absence of physical damage when electrical breakdown occurs, and the ability to construct same using relatively low-cost aluminum and anodized aluminum technology.

These and other objects, features and advantages of the present invention are accomplished in accordance with the teachings of the present invention, one illustrative embodiment of which comprises an electrostatic chuck in which a conductive pole piece is provided with a flat top surface, sidewall and a perimeter with radiused corners connecting the top surface to the sidewall. The perimeter and sidewalls are coated with a ceramic insulative material covering the radiused corners. The top surface is coated with a ceramic semiconductive material. Then the surfaces of the pole piece not covered by ceramic material are anodized in such a manner that the intersections between anodized pole surfaces and ceramic material is below the pole pieces top surface.

BRIEF DESCRIPTION OF THE DRAWING

Other objects, features and advantages of the invention will be apparent from the following description and accompanying drawing wherein.

DETAILED DESCRIPTION

Figure 1:
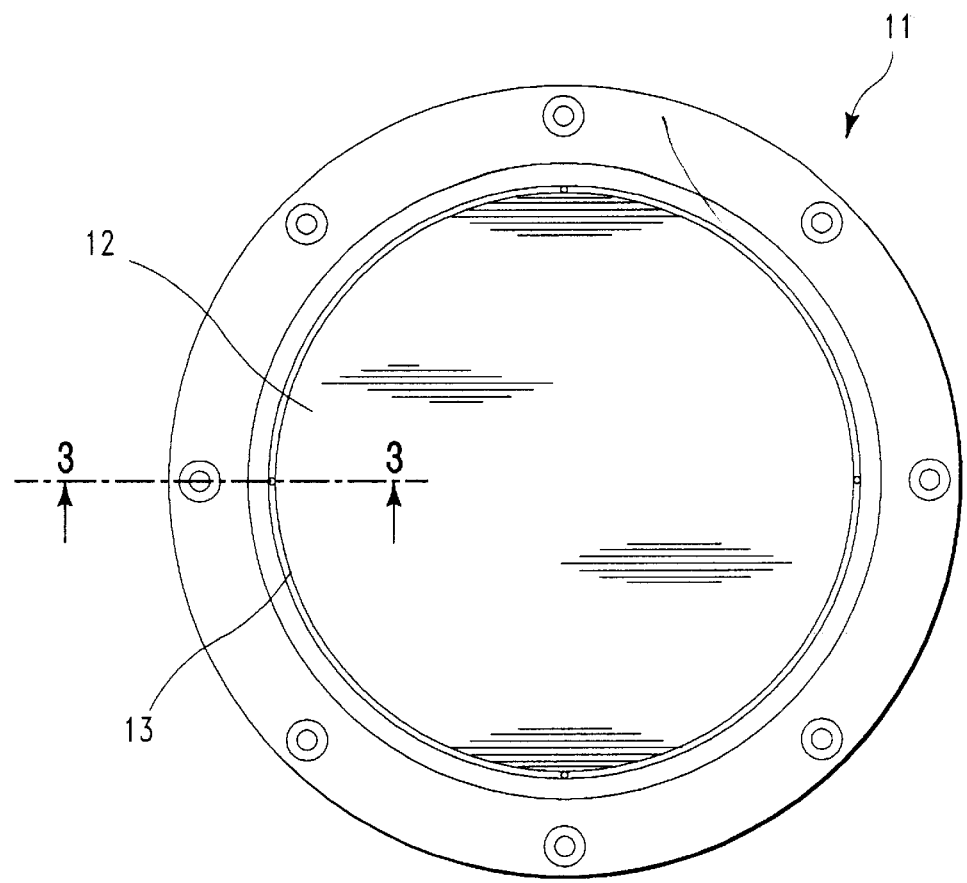
FIG. 1 is a top plan view of a monopolar electrostatic chuck.

In the drawing so much of an electrostatic chuck and parts is shown as is necessary for an understanding of the present invention.

FIG. 1 is a plan view of a monopolar electrostatic chuck, showing an inner disk-shaped pedestal with clamping surface which may have lift-pin holes in it and which extends outward to a groove 13 used for perimeter distribution of a backside gas, typically helium. The helium is supplied to this perimeter gas groove by means of appropriate internal gas passageways from a common backside feed point. Outside the gas groove is a short (typically 4 mm) radial annulus which makes a seal against the clamped wafer (not shown) to prevent backside gas from escaping to the surrounding volume which is typically at lower pressure.

Figure 2:
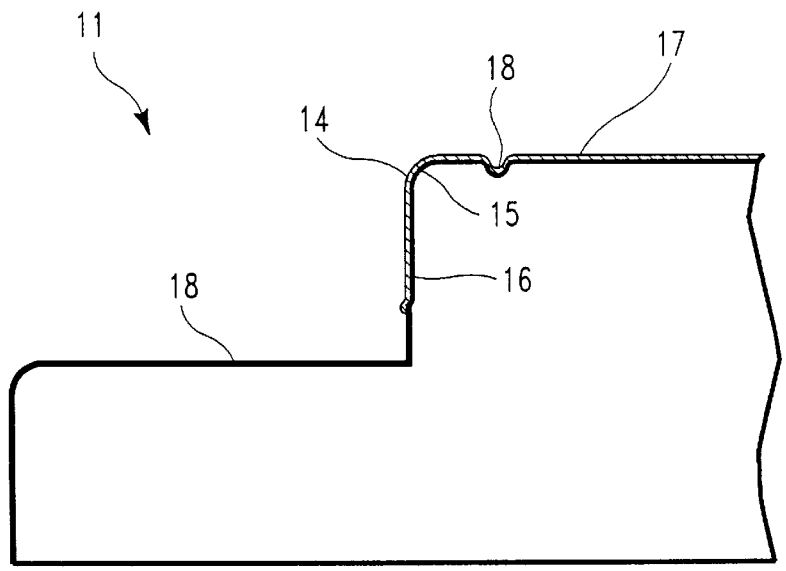
FIG. 2 is a cross sectional view of the perimeter region of a novel monopolar electrostatic chuck constructed in accordance with the teachings of the present invention before grinding.

In order to protect material applied to the perimeter of the pedestal, in accordance with the teachings of the present invention and as shown in FIG. 2, a ceramic insulative coating 14 is applied directly on the chuck pedestal 12 (typically aluminum alloy) to a radiused corner region 15 that extends inward on the clamping surface to the surface gas groove 13, where it is terminated by using an appropriate mask during coating. An appropriate thickness for this coating 14 is 0.010 inch. An appropriate radius for the corner 15 is 0.060 inch to reduce and distribute stress in the coating. The coating 14 extends outward and down the recessed side 16 of the pedestal 12 to a point where the recess is terminated, again by an appropriate mask during coating.

Following the perimeter coating process, a layer of semi conducting ceramic 17 of appropriate resistivity is applied to the top surface only extending out to the gas groove 13 and slightly overlapping the previously applied layer of insulative ceramic 14. The thickness of the semi conducting layer 17 must be more than the final desired thickness (e.g. 0.010 inch). Then the top surface is ground flat to produce a final clamping surface thickness (e.g. 0.008 inch), leaving a joint between semiconductor ceramic and insulating ceramic in the gas groove 13 or approximately so as shown in FIG. 3.

To complete the construction of the electrostatic monopolar chuck, the rest of the exposed aluminum alloy is anodized as at 18 to an appropriate thickness such as 2.0 mils wherever desired. Thus the outer perimeter of the chuck 11 in the most critical areas is protected from the plasma by an insulating coating 14 of ceramic which extends inward approximately to the perimeter gas groove.

Figure 4:
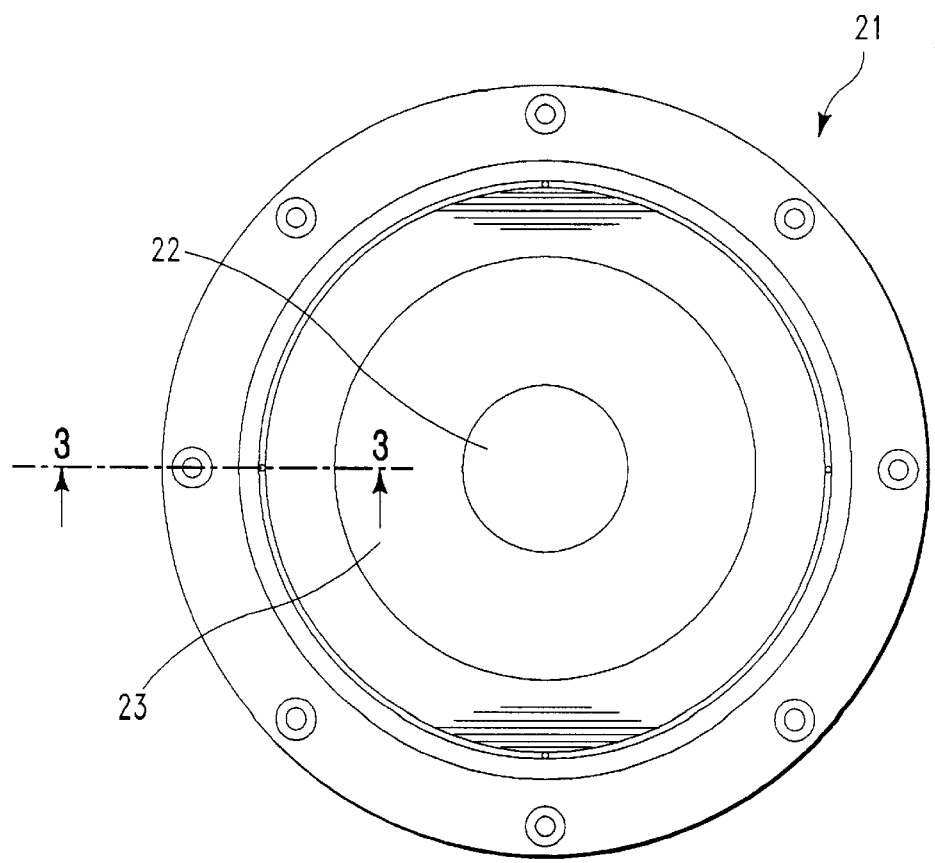
FIG. 4 is a top plan view of a bipolar electrostatic chuck without frame.
Figure 5:
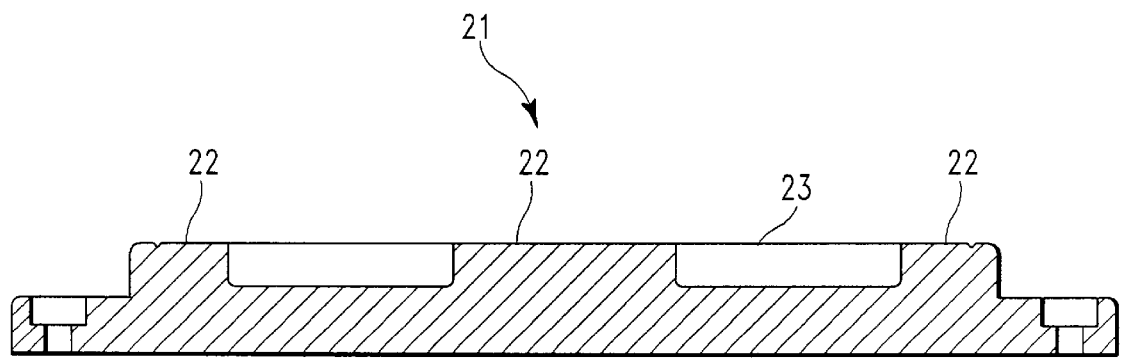
FIG. 5 is a cross-sectional view of the bipolar electrostatic chuck of FIG. 4 again without a frame.

Referring now to FIG. 4 there is shown an electrostatic chuck 21 with two isolated poles pieces 22, 23 a first pole 22 having an annular recess in its surface and a second annular pole piece 23 which fits into the recess on the first pole piece. FIG. 5 shows the bipolar chuck of FIG. 4 in cross section.

Figure 3:
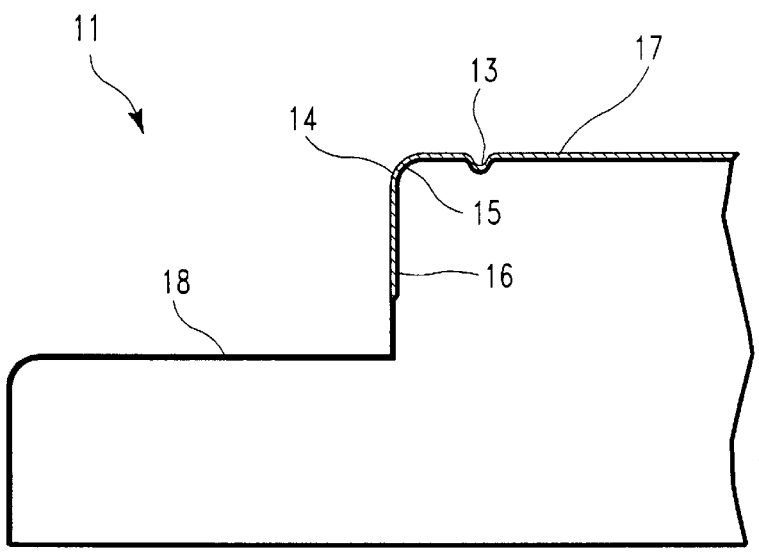
FIG. 3 is a cross sectional view of the perimeter region of a novel monopolar electrostatic chuck constructed in accordance with the teachings of the present invention after grinding.
Figure 6:
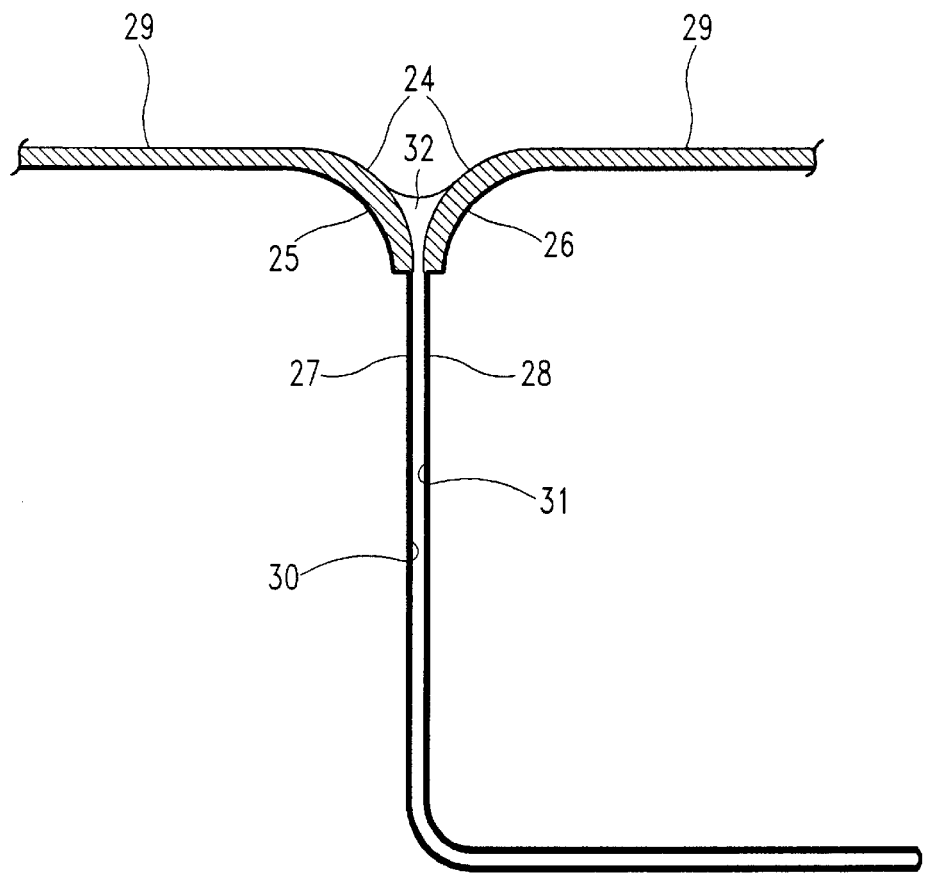
FIG. 6 is a cross-sectional view of the joint areas of the bipolar electrostatic chuck of FIGS. 4 and 5.

As with the embodiment depicted in FIG. 2 and 3, and in accordance with the teachings of the present invention and as shown in FIG. 6, a ceramic insulative coating 24 is applied to the pole pieces 22, 23 over their radiused corner regions 25, 26 and down their sides 27, 28. The pole pieces are coated on the top surface, as by spray coating, with semiconductive ceramic 29. This ceramic layer 29 extends to a joint line which is created in the machining of the pole pieces at a point where the corner radius is tangent to a vertical, or 0.060 inch down from the top surface, using appropriate masking and edge grinding, if needed. The depth of this radiused recess is approximately the same as the final desired thickness, such as 0.008 inch.

After the clamping surfaces have been spray coated with the chosen semi conducting ceramic 29, the exposed portions of the pole pieces are anodized at 31, 32.

The pole pieces 22, 23 are then bonded together using an appropriate bonding agent 32 such as epoxy. Additionally, a thin (typically 1 mil) polyimide sheet 33 may be inserted in the vertical joints during bonding to enhance the electrical isolation between the edges of the pole pieces which are at different dc potentials. Also, the bonding material 32 may be allowed to fill the joints close to the clamping surface, typically within 0.001" of the surface so that the ceramic/anodization intersection is completely covered.

The ceramic may be ground before and/or after assembly in order to produce an extremely flat and coplanar clamping surface.

Figure 7:
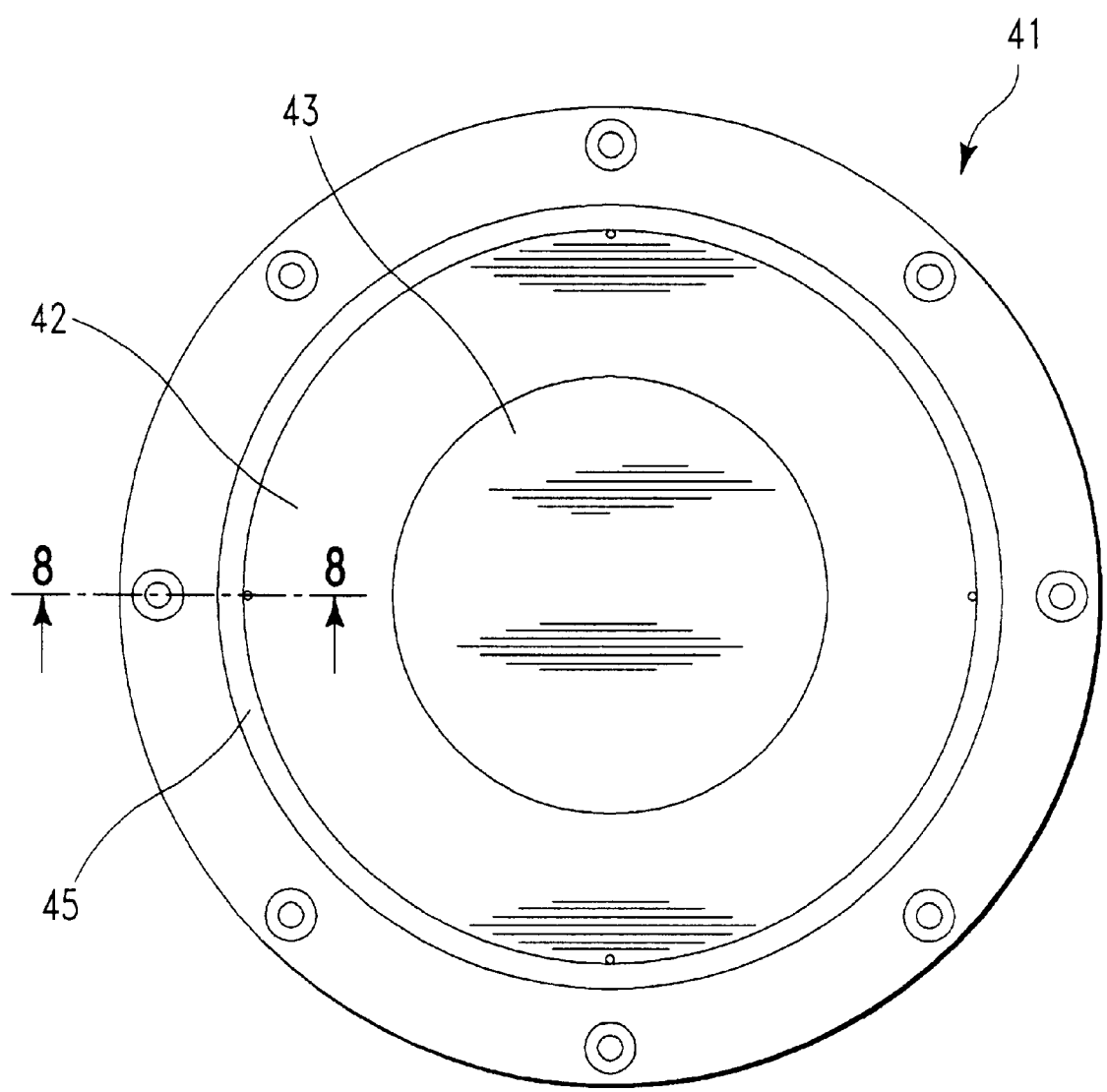
FIG. 7 is a top plan view of a bipolar electrostatic chuck with frame.
Figure 8:
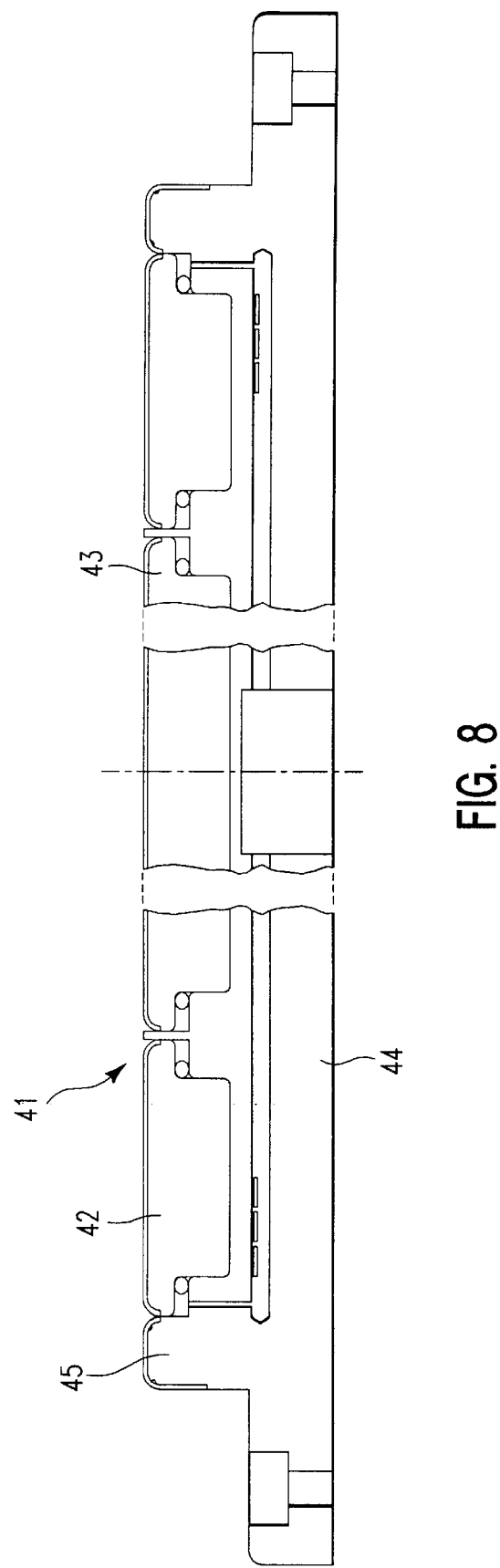
FIG. 8 is a cross-sectional view of the bipolar electrostatic chuck of FIG. 7.

Referring now to FIGS. 7 and 8 there is shown an electrostatic chuck with pole pieces 42, 43, inset into but electrically isolated from a frame 44 and its rim 45. In this case the first pole 42 is annular shaped and surrounds the second disc shaped pole piece 43.

Figure 9:
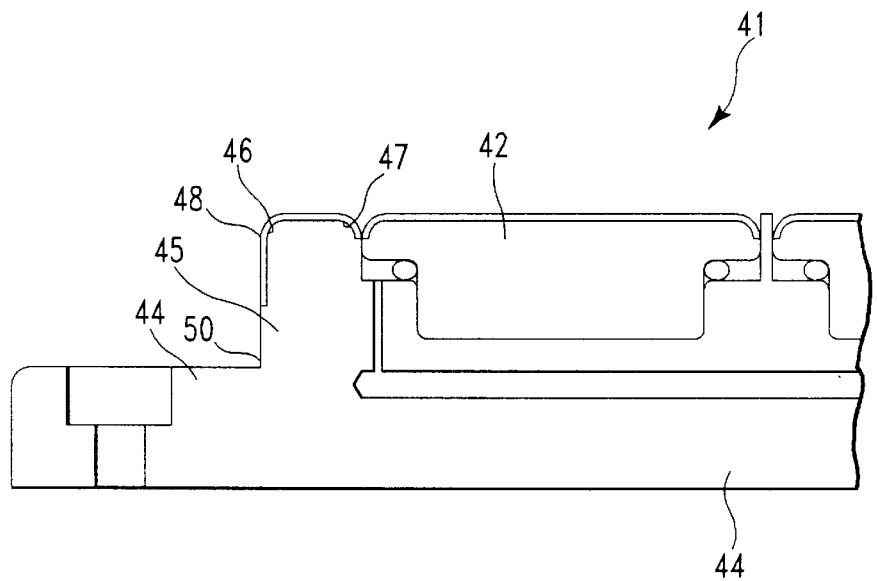
FIG. 9 is a cross-sectional view of the perimeter area of the bipolar electrostatic chuck of FIGS. 7 and 8; and, FIG. 10 is a cross-sectional view of a monopolar electrostatic chuck with ceramic outer rim.

To protect the perimeter of this type chuck and in accordance with the teachings of the present invention a design as depicted in FIG. 9 is utilized.

The rim 45 is machined into the frame at the perimeter of the pedestal 42. This rim 45 is radiused on its outer 46 and inner 47 corners to approximately 0.060 to reduce coating stresses, including a horizontal recess to accept a layer of insulative ceramic 48 covering the rim 45 down to a depth of 0.060 or greater from the top surface. The coating 48 is confined to the regions shown in FIG. 9 by masking and, if necessary, edge grinding.

Pole pieces 42, 43 are prepared in the same manner as described above (FIG. 6) to allow coating of a semiconductive layer 49 on top of each piece, extending a distance of approximately 0.060 in. down at the perimeter edges.

After ceramic coatings have been applied, all pieces are anodized as at 50 to insulate all areas in the joints that are to be insulating. Masking can be used to prevent anodization of areas on the back of the frame that may be required to be free of anodization. Then the two pole pieces are bonded together into the frame using appropriate joining materials such as epoxy to form the assembled chuck.

Figure 10:
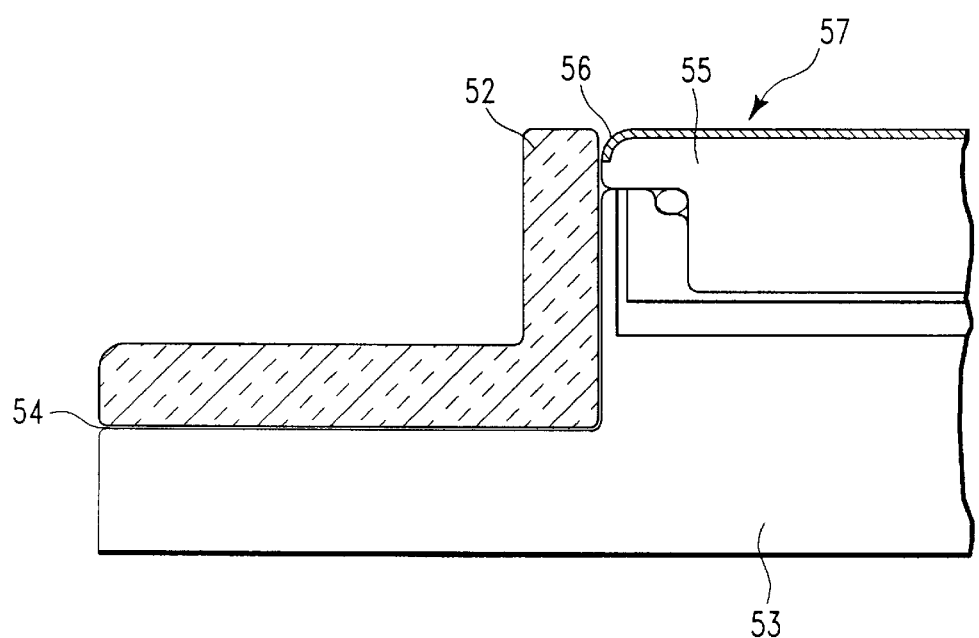

As an alternative to the embodiments previously described herein and in accordance with further teachings of the present invention, a solid ceramic ring may be shaped to surround any of the above-mentioned types of chucks, replacing the need for sprayed ceramic insulative material on the outermost pole piece or frame. An example of this alternative is shown in FIG. 10 for a monopolar chuck 57. In this case, a separate ceramic ring 52 is fabricated by conventional means. The perimeter of the chuck frame or outer pole piece is recessed at 54 in the flange area to accept the ceramic ring 52 which extends upward to protect the perimeter of the outer clamping pole 55. The ceramic ring 52 is then bonded to the aluminum frame 53 with appropriate bonding material such as epoxy. Alternatively, a series of ceramic ring portions can be fabricated and assembled with bonding material to enclose the perimeter.

A thick insulative ceramic piece 52 at the perimeter of clamping electrodes assures that any contact with the plasma at the perimeter cannot create transient electrical disturbances that may result in loss of clamping or arcing. The methodologies described above work by eliminating stress-cracking of the materials and defining the coated areas. Furthermore, the underlying anodization coatings are applied in a sequence that guarantees a void-free joint area because the anodization process converts any exposed aluminum (after ceramic coatings) to an anodic oxide layer.

The polymide sheet optionally may be inserted into the joint areas which would simply provide additional protection against arcing in the joints where the ceramic thickness may be diminished and the probability of stress-cracking is higher. Sealing this potential defect area further with the bonding material gives a third level of protection from breakdown.

By creating a recessed radius at the edges, we allow the deposited ceramic 56 to terminate at a controlled depressed point on the vertical wall, without being reduced in thickness at the joint. This creates the favorable conditions for protecting this critical area as described in FIG. 2.

It is known that thick insulative ceramic materials can successfully prevent electrical contact between the plasma surrounding an electrostatic chuck and the conductive pole pieces. What is not known generally is the particular combination of materials, surface geometries, and construction sequence that yields a successful solution to this problem, as taught herein.

This design and construction methodology allows us to successfully combine the advantages of semiconductive ceramic materials with a proven low-cost aluminum/anodized technology in making monopolar, bipolar or multipolar electrostatic chucks having insulated joints between the poles and semiconductive ceramic clamping surfaces as well as insulative ceramic perimeter protection. The weakest area of the combined materials is the area where ceramic meets anodization. This invention solves the problem of how to make void-free joints and how to remove and protect that joint from the high-stress clamping surface.

It should be obvious that changes, additions and omissions may be made in the details and arrangement of parts, without departing from the scope of this invention.

We claim:

1. In an electrostatic chuck:
an electrically conductive pole piece having
a flat top surface
a sidewall
the flat top surface having a perimeter
a radiused corner connecting the perimeter to the sidewall
a ceramic insulative coating applied to the pole piece perimeter and sidewall covering the radiused corner;
a ceramic semiconductor coating applied to the pole piece top surface;
the surface of the pole piece not coated being anodized;
an intersection formed between the anodized surface of the pole piece and the ceramic insulative coating;
the intersection being disposed below the top surface of the pole piece.

2. The invention defined by claim 1 including an insulative ceramic ring surrounding and protecting the pole piece perimeter.

3. In an electrostatic chuck:
at least a pair of electrically conductive pole pieces, each pole piece having
a flat top surface
a sidewall
the flat top surface having a perimeter
a radiused corner connecting the perimeter to the sidewall
a ceramic insulative coating applied to each pole piece perimeter and sidewall covering the radiused corner;
a ceramic semiconductive coating applied to each pole piece top surface;
the surface of each pole piece not coated being anodized;
an intersection formed between the anodized surface of each pole piece and its ceramic insulative coating;
the intersections being disposed below the top surface of the pole pieces;
bonding material joining the pole pieces and covering the ceramic/anodized intersection.

4. The invention defined by claim 3 including a polymide sheet disposed between the pole piece sidewalls below the bonding material.

5. In an electrostatic chuck:
A first annular shaped pole piece and a second disc shaped pole piece surrounded by the first pole piece, each pole piece having
a flat top surface
a sidewall
the flat top surface having a perimeter
a radiused corner connecting the perimeter to the sidewall
a frame for supporting the pole pieces and having a rim disposed between the first and second pole pieces and having,
a top surface
sidewalls
radiused corners connecting the sidewalls to the top surface;
a ceramic insulative coating applied to each pole piece perimeter and each pole piece sidewall and covering the radiused corners of each pole piece and the ceramic insulative coating being applied to the frame rim covering the frame rim top surface, frame rim radiused corners and frame rim sidewalls of the rim;
a ceramic semiconductive coating applied to each pole piece top surface;
the surfaces of each pole piece and frame not coated being anodized;
an intersection formed between the anodized surface of each pole piece and frame and their respective ceramic insulative coating;
the intersection being disposed below the top surface of each pole piece and frame.

6. In the method of forming an electrostatic chuck, the steps comprising;
providing a conductive pole piece with a flat top surface, sidewalls and a perimeter with radiused corners connecting the top surface to the sidewalls;
coating the perimeter and radiused sidewalls with a ceramic insulative material covering the radiused corners;
coating the pole piece top surface with a ceramic semiconductive material; and
anodizing the surfaces of the pole piece not covered by ceramic insulative material and in such manner that the intersection between the anodized pole surface and insulative ceramic material is below the pole piece top surface.

* * * * *